US012782473B1

(12) United States Patent
Tan et al.

(10) Patent No.: US 12,782,473 B1
(45) Date of Patent: Nov. 3, 2026

(54) MAGNETORESISTIVE SENSOR COMPRISING A LAMINATED FREE LAYER

(71) Applicant: Seagate Technology LLC, Fremont, CA (US)

(72) Inventors: Liwen Tan, Eden Prairie, MN (US); Jae Young Yi, Prior Lake, MN (US); Eric Singleton, Delano, MN (US)

(73) Assignee: Seagate Technology LLC, Fremont, CA (US)

( * ) Notice: Subject to any disclaimer, the term of this patent is extended or adjusted under 35 U.S.C. 154(b) by 259 days.

(21) Appl. No.: 18/528,997

(22) Filed: Dec. 5, 2023

Related U.S. Application Data

(60) Provisional application No. 63/477,581, filed on Dec. 29, 2022.

(51) Int. Cl.
*G01R 33/09* (2006.01)

(52) U.S. Cl.
CPC .................................. *G01R 33/098* (2013.01)

(58) Field of Classification Search
CPC .. G01R 33/098; G01R 33/093; G01R 33/091; G01R 33/09; G01R 33/095; G01R 33/096
See application file for complete search history.

(56) References Cited

U.S. PATENT DOCUMENTS

| | | | | |
|---|---|---|---|---|
| 8,531,802 | B2 | 9/2013 | Tsoukatos et al. | |
| 9,070,381 | B1 | 6/2015 | Yang et al. | |
| 9,099,124 | B1 * | 8/2015 | Freitag | G01R 33/098 |
| 9,214,169 | B1 * | 12/2015 | Kaiser | G01R 33/098 |
| 9,705,072 | B2 | 7/2017 | Li et al. | |
| 11,283,006 | B1 | 3/2022 | Freitag et al. | |
| 2016/0315249 | A1 * | 10/2016 | Kardasz | H10N 50/10 |

OTHER PUBLICATIONS

2010, I. Shao n, L.T. Romankiw, C. Bonhote (Title: Stress inelectrodepositedCoFealloyfilms, 2010). Journal of Crystal Growth 312( 2010)1262-1266.*

* cited by examiner

*Primary Examiner* — Alvaro E Fortich
(74) *Attorney, Agent, or Firm* — Mueting Raasch Group

(57) ABSTRACT

A magnetoresistive sensor including a spacer layer, a cap layer, and a laminated free layer between the spacer layer and the cap layer is described. The laminated free layer includes a stack with alternating ferromagnetic and separation layers. The separation layer of the laminated free layer includes a magnetic or non-magnetic material.

16 Claims, 4 Drawing Sheets

MAGNETORESISTIVE SENSOR COMPRISING A LAMINATED FREE LAYER

This application claims priority to U.S. Provisional Patent Application Ser. No. 63/477,581 entitled "MAGNETORESISTIVE SENSOR COMPRISING A LAMINATED FREE LAYER" and filed Dec. 29, 2022, the entire contents of which are hereby incorporated by reference.

BACKGROUND

Data storage devices commonly include a recording head that includes a reader that reads information from a data storage medium and a write transducer that writes information to a data storage medium. In magnetic data storage devices such as hard disc drives, a magnetoresistive (MR) sensor, such as a tunneling giant magnetoresistive (TGMR) sensor may be employed as the reader to read a magnetic signal from the magnetic media. The MR sensor has an electrical resistance that changes in response to an external magnetic field. This change in electrical resistance may be detected by processing circuitry in order to read magnetic data from the adjacent magnetic media.

With ever-increasing levels of recording density in disc drives and a need for faster data transfer speeds, the reader needs to have correspondingly better data-reproducing capabilities. However, many readers may be scaled to substantially fit the dimensions of narrow data tracks in disc drives having a high recording density. As areal density increases, both reader width and reader shield-to-shield (SSS) spacing decrease to enable sensing of narrower written tracks and reduced bit length. Electronic and/or magnetic noise may increase with a reduction in reader size/volume to fit the dimensions of the narrow data tracks.

A high moment magnetic free layer may be used to decrease noise and improve SNR in the reader. Cobalt iron (CoFe) alloys may provide high magnetization (up to 2.45 Tesla) and may be used as a free layer material to boost the free layer magnetic moment. However, high moment material may also come with high coercivity due to magnetocrystalline anisotropy which can cause performance issues in the reader.

SUMMARY

The present disclosure describes a magnetoresistive sensor which includes a free layer that provides both high magnetic moment and low coercivity. The magnetoresistive sensor comprises a spacer layer, a cap layer, and a laminated free layer disposed between the spacer layer and the cap layer. The laminated free layer comprises a layered stack comprising alternating ferromagnetic layers and separation layers where the separation layer comprises a magnetic or non-magnetic material.

In some scenarios, a reader, for example, for reading data from magnetic media in a hard disk drive, includes a spacer layer, a cap layer and a laminated free layer. In some implementations, the free layer includes a plurality of at least two repeating layers of a ferromagnetic layer and a separation layer. In some implementations, the ferromagnetic layer includes a CoFe alloy with a magnetization direction oriented substantially parallel to an air-bearing surface of the reader.

These and other features and aspects of various examples may be understood in view of the following detailed discussion and accompanying drawings.

DETAILED DESCRIPTION

Figure 1:
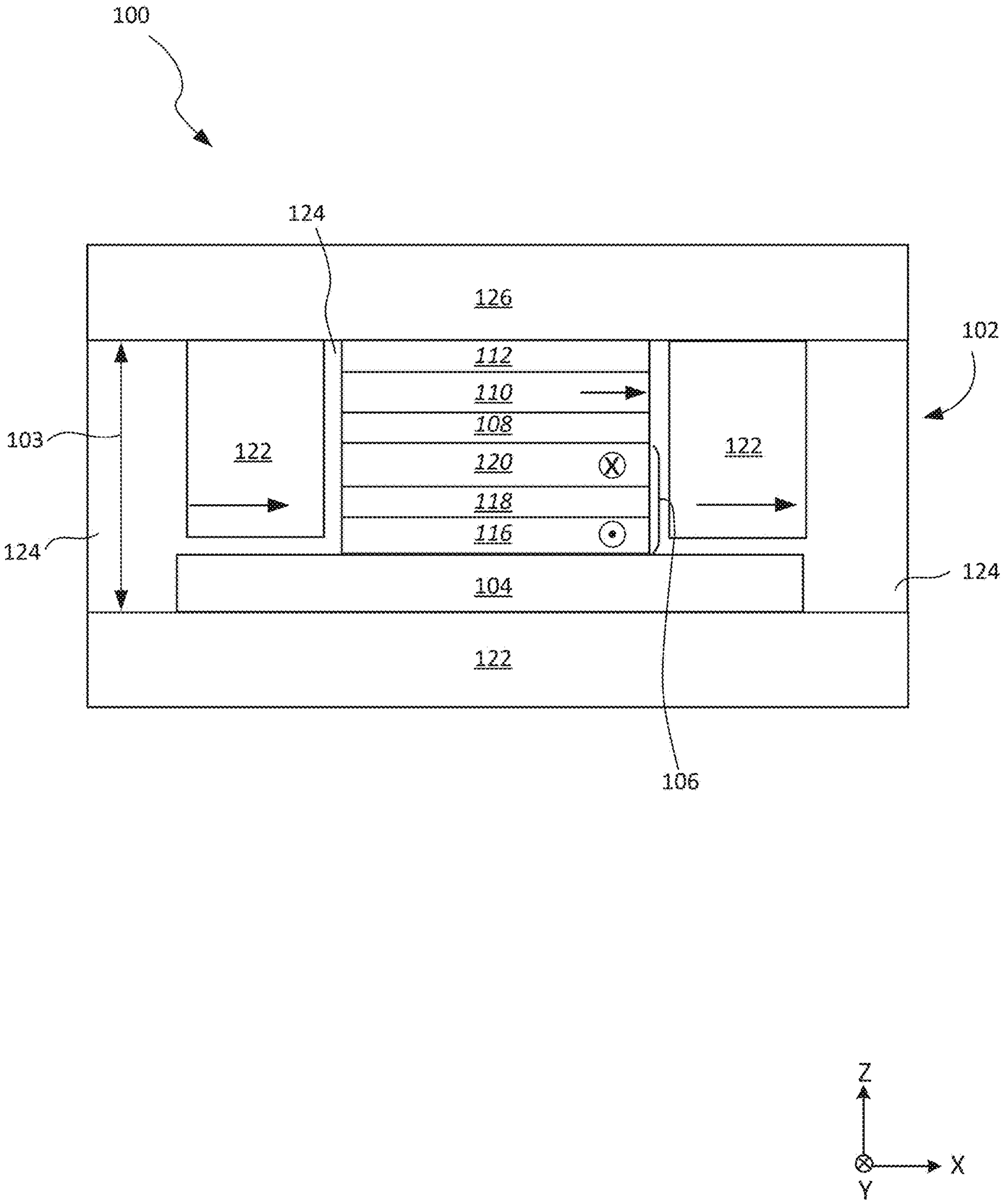
FIG. 1 is an air-bearing surface view of a reader, according to various aspects of the present disclosure.

FIG. 1 is an air-bearing surface view of a reader, according to various aspects of the present disclosure. FIG. 1 illustrates a schematic block diagram of an example reader 100 including a single magnetoresistive sensor 102. In some examples, a reader may comprise multiple magnetoresistive sensors. Magnetoresistive sensor 102 is positioned between top shield 126 and bottom shield 122. Downtrack magnetic resolution is inversely proportional to the distance between top shield 126 and bottom shield 122. This distance is also known as shield-to-shield spacing (SSS) 103 and corresponds to increased storage capacity as SSS 103 decreases. Top and bottom shields 126 and 122, reduce or substantially block extraneous magnetic fields from impacting magnetoresistive sensor 102. Extraneous magnetic fields may be, for example, from adjacent bits on data discs, and if not blocked, can impact the performance of magnetoresistive sensor 102. Top and bottom shields 126 and 122 may be made of a material having high magnetic permeability. In one implementation, top shield 126 and bottom shield 122 permit magnetic fields from the bit directly under magnetoresistive sensor 102 to affect magnetoresistive sensor 102, and thus be read.

Magnetoresistive sensor 102 includes a plurality of layers including sensor antiferromagnetic (AFM) layer 104, sensor stack synthetic antiferromagnetic (SAF) structure 106, spacer layer 108, free layer 110, and stack cap 112. In some scenarios, a SAF shielding structure may be disposed between stack cap 112 and top shield 126.

In the example shown in FIG. 1, sensor stack SAF structure 106 includes pinned layer 116, thin SAF separation layer 118, and reference layer 120. Thin SAF separation layer 118 may comprise a metal such as ruthenium (Ru). The magnetic moments of each of pinned layer 116 and reference layer 120 are not allowed to rotate under magnetic fields in the range of interest (for example, magnetic fields generated by the bits of data stored on the data discs). The magnetic moments of reference layer 120 and pinned layer 116 are generally oriented normal to the plane (e.g., in the y direction) of FIG. 1 and anti-parallel to each other.

In some examples, magnetoresistive sensor 102 may utilize tunneling magnetoresistance (TMR) or giant magnetoresistance (GMR) effects. In embodiments that utilize MR effects, spacer layer 108 is a tunneling barrier layer that separates SAF structure 106 from free layer 110. Tunneling barrier layer 108 is sufficiently thin that quantum mechanical electron tunneling occurs between reference layer 120 in SAF structure 106 and free layer 110.

In one example, free layer 110 is not exchange coupled to, for example, an antiferromagnet. As a result, the magnetic moment of free layer 110 is free to rotate under the influence of an applied magnetic field in a range of interest. Reader 100 further includes side biasing magnets or side shields 122, which produce a magnetic field that biases free layer 110 with a magnetic moment parallel to the plane of the figure and generally oriented horizontally. This bias prevents the magnetic moment of free layer 110 from drifting due to, for example, thermal energy, which may introduce noise into the data sensed by reader 100. The bias is sufficiently small, however, that the magnetic moment of free layer 110 can change in response to an applied magnetic field, such as a magnetic field of a data bit stored on the data discs. In some examples, the side biasing magnets or side shields 122 are formed of soft magnetic material (i.e., material that can be easily magnetized and demagnetized at relatively low magnetic fields). The soft magnetic material may be an alloy comprising Ni and Fe. Magnetoresistive sensor 102 is separated and electrically isolated from side shields 122 by isolation layer 124. Isolation layer, 124 may include insulating materials. Isolation layer 124 may also be present in other regions of reader 100 as shown in FIG. 1.

Recent data storage technologies, such as heat-assisted magnetic recording (HAMR), push for increased reader down-track and cross-track resolution. This implies a decrease in reader shield-to-shield spacing as well as reader width, respectively. As shield-to-shield spacing and reader width decrease, there is a corresponding reduction in free layer size, which may lead to signal-to-noise (SNR) degradation due to higher magnetic noise. In addition, free layer thickness reduction may also increase the contribution of spin transfer torque (STT) to noise, leading to further SNR degradation. To address the challenge of free layer size reduction, the structure and composition of the free layer may be adjusted. In one example, the free layer is a laminated free layer and is described in connection with FIG. 2.

Figure 2:
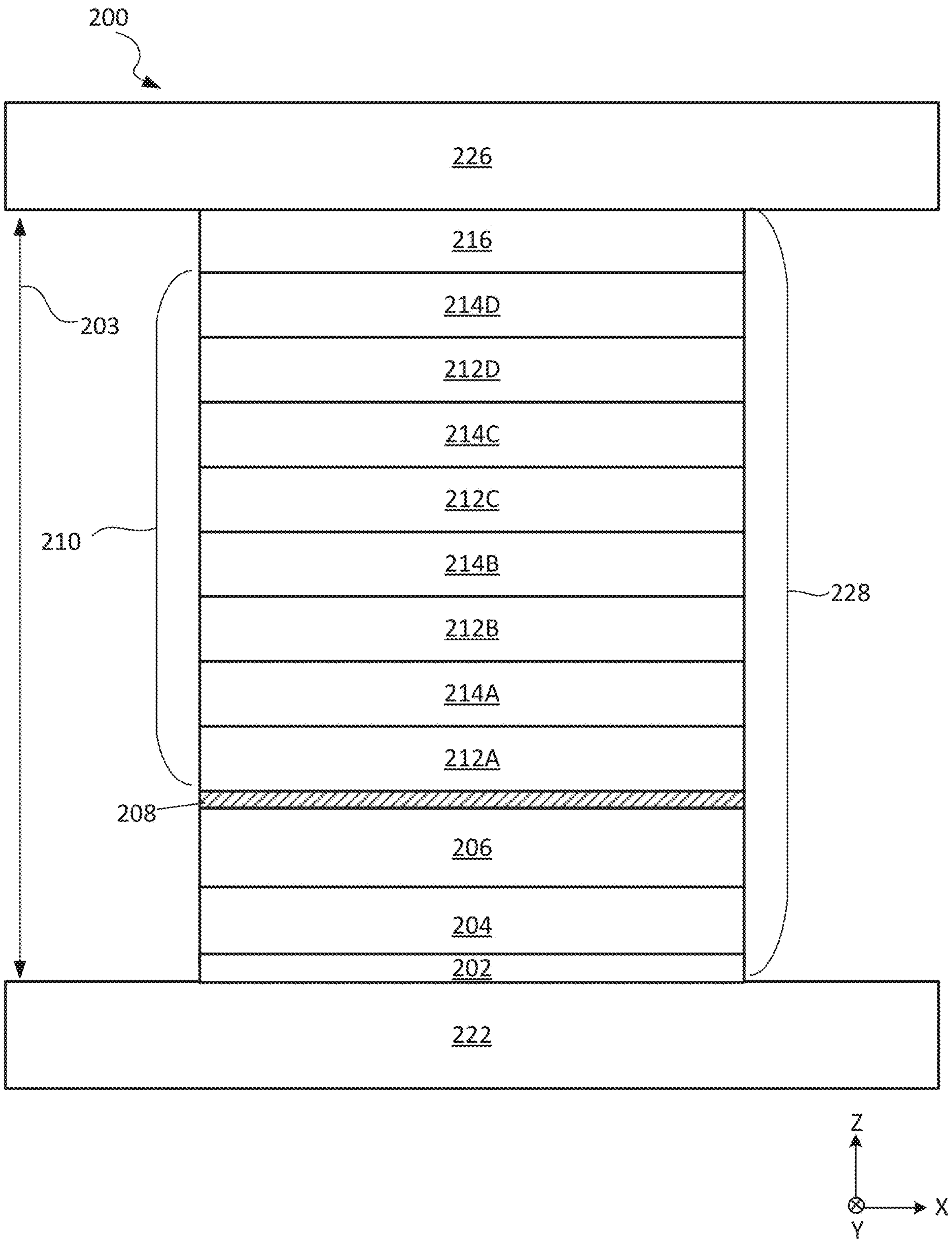
FIG. 2 is an example air-bearing surface view of a portion of a magnetorestrictive sensor with laminated free layer, according to various aspects of the present disclosure.

FIG. 2 is an example air-bearing surface view of a reader with laminated free layer, according to various aspects of the present disclosure. FIG. 2 illustrates reader 200 which includes layers of amorphous magnetic material between soft magnetic layers in a magnetoresistive sensor 228. Magnetoresistive sensor 228 is positioned between a top shield 226 and bottom shield 222 and includes a number of layers that perform a variety of functions. The distance between top shield 226 and bottom shield 222 is known as shield-to-shield spacing (SSS) 203 and corresponds to increased storage capacity as SSS 203 decreases.

Magnetoresistive sensor 228 includes seed layer 202, sensor stack antiferromagnetic (AFM) layer 204, sensor stack synthetic antiferromagnetic (SAF) structure 206, spacer layer 208, laminated free layer 210, and cap layer 216. In some scenarios, certain layers may not be present at the ABS. For example, in some readers, there is no AFM at the ABS. In some examples, spacer layer 208 is an oxide tunneling barrier layer. In other examples, spacer layer 208 may be a metallic layer or may be a combination of a metallic layer and an oxide tunneling barrier layer. In the example of FIG. 2, laminated free layer 210 is disposed between spacer layer 208 and cap layer 216. Laminated free layer 210 includes a stack of alternating ferromagnetic and separation layers. Laminated free layer 210 includes ferromagnetic layers 212A, 212B, 212C and 212D (collectively, ferromagnetic layers 212) and separation layers 214A, 214B, 214C and 214D (collectively, separation layers 214). In some scenarios, a ferromagnetic layer (e.g., ferromagnetic layer 212A-212D) is a first layer, and a separation layer (e.g., separation layer 214A-214D (collectively, separation layers 214) is a second layer.

In one example, ferromagnetic layers 212 may be formed from a magnetic alloy such as CoFe. CoFe alloys with different compositions may be used in ferromagnetic layers 212. The Fe composition in a CoFe alloy may range from about 10 atomic % to about 90 atomic %. The z-direction thickness of ferromagnetic layers 212 may be less than about 1.5 nanometers (nm). Magnetoresistive sensor 228 includes side shields (e.g., side shields 122 of FIG. 1, not shown in FIG. 2) which provide a magnetic field that biases ferromagnetic layers 212 with a magnetic moment parallel to an air-bearing surface of magnetoresistive sensor 228. The magnetic moment of ferromagnetic layers 212 is free to rotate under the influence of an applied magnetic field in a range of interest.

In some examples, ferromagnetic layers 212 may comprise a high moment CoFe alloy where the magnetic moment of the high moment CoFe alloy is at least 2.4 T. The Fe composition in a high moment CoFe alloy may range from about 10 atomic % to about 90 atomic %. Forming ferromagnetic layers 212 from a high moment CoFe alloy increases the magnetic flux in free layer 210 and may lead to an improvement in SNR as well as an improvement of asymmetry mean in the reader. High moment materials also tend to have high coercivity and magnetic non-uniformity, which conversely may cause reduced SNR and create instability in magnetoresistive sensor 228. In the example where a high moment CoFe alloy is used in ferromagnetic layers 212, high coercivity may be due to high magnetocrystallinity. The magnetocrystallinity of high moment CoFe may be reduced by including a separation layer (e.g., separation layers 214), between ferromagnetic layers 212. Including separation layers 214 between ferromagnetic layers 212 can interrupt grain growth in the example where ferromagnetic layers 212 include high moment CoFe alloy, thus softening the material.

Separation layers 214 may comprise a magnetic or a non-magnetic layer. In some examples, separation layer 214 includes a magnetic alloy such as CoFeX, where X includes tantalum (Ta), zirconium (Zr), hafnium (Hf), titanium (Ti), niobium (Nb), yttrium (Y), vanadium (V), molybdenum (Mo), tungsten (W), or boron (B). The z-direction thickness of CoFeX in separation layer 214 may range from about 0.2 nm to about 3 nm. The concentration of X in separation layers 214 may range from about 2 atomic % to about 40 atomic %. The concentration of Fe in separation layers 214 may range from about 10 atomic % to about 80 atomic %. In some scenarios, separation layers 214 may include a single elemental metal, for example Ta, Zr, Hf, Ti, Cr, Nb, Y, V, Mo or W, or others. In the scenario where separation layer 214 is a single elemental metal, the z-direction thickness of separation layers 214 may range from about 0.2 nm to about 0.5 nm. In other examples, separation layers 214 may include a metal oxide, for example an oxide of Ta, Zr, Hf, or Ti. In the example where separation layers 214 is an oxide, the z-direction thickness of separation layers 214 may range from about 0.2 nm to about 0.5 nm. In other examples, separation layers 214 may be any amorphous or nanocrystalline magnetic material or may be a magnetic material with a high crystallization temperature. In examples where a non-magnetic separation layer is used, the thickness of separation layers 214 is limited such that the total flux and average magnetization of free layer 210 is not substantially reduced. It should be noted that, in some cases, each of separation layers 212A-212D comprise the same material and/or the same thickness. Conversely, in other cases, each of separation layers 212A-212D may comprise different materials and/or different thickness.

In the scenario described in FIG. 2, laminated free layer 210 comprises 4 ferromagnetic layers (e.g., ferromagnetic layers 212A, 212B, 212C, and 212D) and 4 separation layers (e.g., separation layers 214A, 214B, 214C, and 214D). In some examples, the number of ferromagnetic layers 212 is at least 2 and the number of separation layers 414 is at least 2.

The number of separation layers and the number of ferromagnetic layers may be increased or decreased to meet the performance and dimensional requirements of the reader. SNR and PW50 are primary parameters controlling reader performance. Design requirements for optimal PW50 and optimal SNR may sometimes be in conflict with one another. PW50, which is the pulse width of a reader at 50% of the pulse amplitude, is indicative of the spatial resolution of the reader. The PW50 of a reader depends on the SSS (e.g., SSS 203) of a reader (e.g., reader 200). As SSS decreases, PW50 improves. In contrast, SNR may benefit from an increase in SSS by way of a thicker free layer (e.g., free layer 210). Thus, the number of repeats of ferromagnetic layers 212 and number of repeats of separation layers 214 may be optimized to meet both PW50 and SNR requirements.

In the example of FIG. 2, the first layer in free layer 210 is ferromagnetic layer 212A and is disposed proximate spacer layer 208. FIG. 2 further illustrates that the last layer in free layer 210 is separation layer 214D. In some scenarios, the first layer in free layer 210 may be a separation layer and the last layer in free layer 210 may be a ferromagnetic layer. In other examples, the first layer in free layer 210 may be a separation layer and the last layer in free layer 210 may be a separation layer. Alternatively, in some scenarios, first layer in free layer 210 may be a ferromagnetic layer and last layer in free layer 210 may be a ferromagnetic layer. These examples are further described in connection with FIGS. 3A, 3B, and 3C.

Figure 3A:
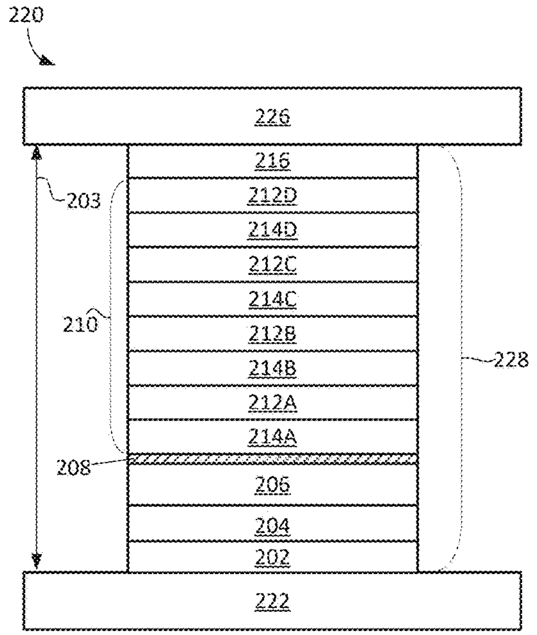
FIGS. 3A, 3B and 3C illustrate example air-bearing surface views of a reader with laminated free layer, according to various aspects of the present disclosure.
Figure 3B:
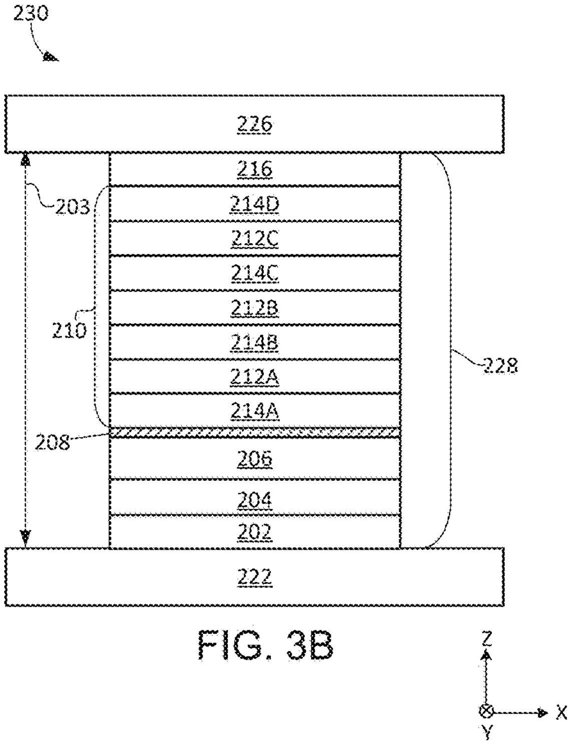
Figure 3C:
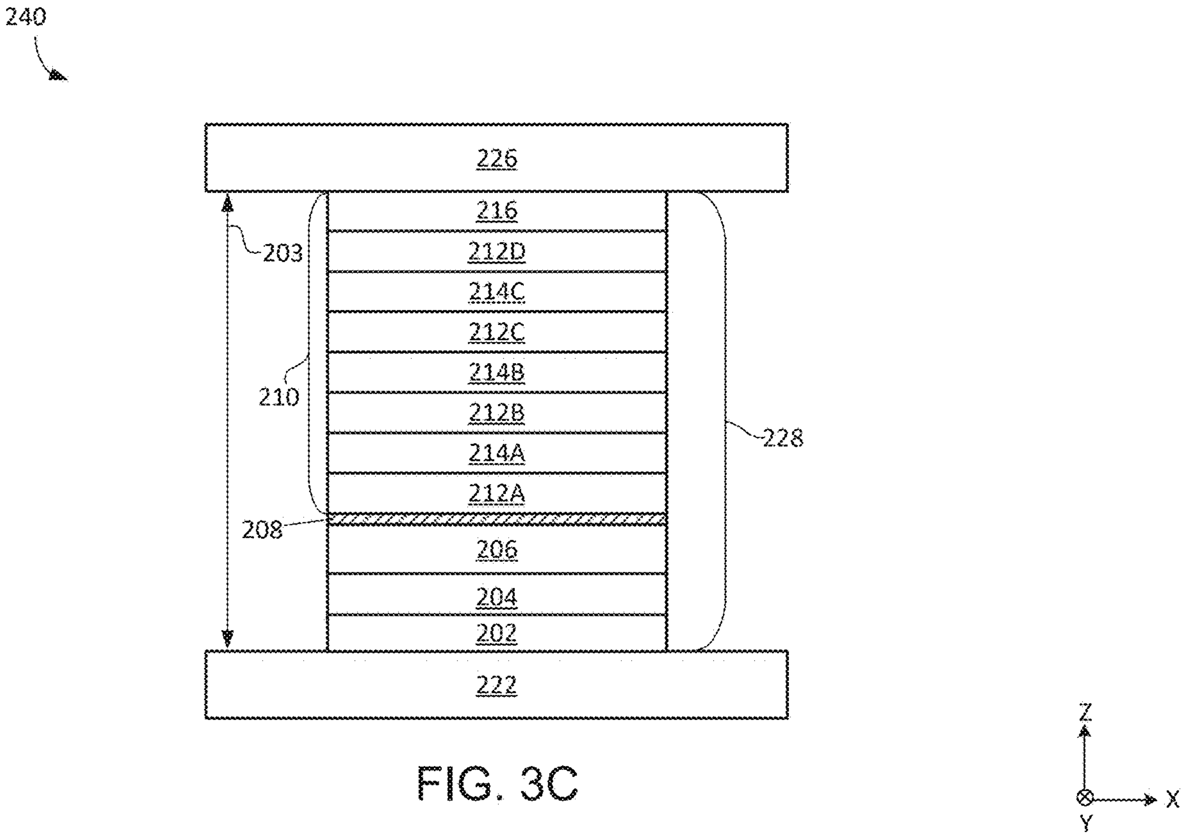

FIGS. 3A, 3B and 3C illustrate example air-bearing surface views of a reader with laminated free layer, according to various aspects of the present disclosure. FIG. 3A illustrates reader 220 where the first layer in free layer 210 is separation layer 214A and the last layer in free layer 210 is ferromagnetic layer 212D. In the example of FIG. 3A, separation layer 214A is proximate spacer layer 208. Cap layer 216 is proximate ferromagnetic layer 212D.

FIG. 3B illustrates reader 230 where the first layer in free layer 210 is separation layer 214A and the last layer in free layer 210 is separation layer 214D. In the example of FIG. 3B, separation layer 214A is proximate spacer layer 208. Cap layer 216 is proximate separation layer 214D.

FIG. 3C illustrates reader 240 where the first layer in free layer 210 is ferromagnetic layer 212A and the last layer in free layer 210 is ferromagnetic layer 212D. In the example of FIG. 3C, ferromagnetic layer 212A is proximate spacer layer 208 and cap layer 216 is proximate ferromagnetic layer 212D.

Various examples have been presented for the purpose of illustration and description. These and other examples are within the scope of the following claims.

What is claimed is:

1. A magnetoresistive sensor comprising:

a spacer layer;

a cap layer; and a laminated free layer disposed between the spacer layer and the cap layer, the laminated free layer comprising:

a layered stack comprising alternating ferromagnetic layers and separation layers, wherein the layered stack comprises at least two of the ferromagnetic layers and at least two of the separation layers, wherein the ferromagnetic layers comprise a cobalt iron (CoFe) alloy, wherein the separation layers comprise a cobalt iron-X (CoFeX) alloy, wherein X comprises at least one of tantalum (Ta), zirconium (Zr), hafnium (Hf), titanium (Ti), chromium (Cr), niobium (Nb), yttrium (Y), vanadium (V), molybdenum (Mo), tungsten (W), or boron (B).

2. The magnetoresistive sensor of claim 1, wherein the ferromagnetic layer is a first layer, and the separation layer is a second layer.

3. The magnetoresistive sensor of claim 1, wherein the separation layer is a first layer, and the ferromagnetic layer is a second layer.

4. The magnetoresistive sensor of claim 2, wherein the first layer is proximate the spacer layer and the second layer is proximate the first layer.

5. The magnetoresistive sensor of claim 1, wherein a concentration of Fe in the high moment CoFe alloy is from 20 atomic % to 80 atomic %.

6. The magnetoresistive sensor of claim 1, wherein a thickness of the ferromagnetic layers is less than 1.5 nanometers (nm).

7. The magnetoresistive sensor of claim 1, wherein a concentration of X in the separation layers is from 2 atomic % to 40 atomic %.

8. The magnetoresistive sensor of claim 1, wherein a concentration of Fe in the separation layers is from 10 atomic % to 80 atomic %.

9. The magnetoresistive sensor of claim 1, wherein the separation layers comprises an oxide.

10. The magnetoresistive sensor of claim 1, wherein a thickness of the separation layers is from 0.2 nanometers (nm) to 3 nanometers (nm).

11. The magnetoresistive sensor of claim 1 wherein the laminated free layer comprises more than 2 of the ferromagnetic layers.

12. The magnetoresistive sensor of claim 1 wherein the laminated free layer comprises more than 2 of the separation layers.

13. A reader comprising:

a spacer layer;

a cap layer; and a laminated free layer disposed between the spacer layer and the cap layer, the laminated free layer comprising:

a layered stack comprising alternating ferromagnetic layers and separation layers, wherein the separation layer comprises a magnetic or non-magnetic material, wherein the layered stack comprises at least two of the ferromagnetic layers and at least two of the separation layers, wherein the ferromagnetic layers comprise a cobalt iron (CoFe) alloy, wherein the separation layers comprise a cobalt iron-X (CoFeX) alloy, wherein X comprises at least one of tantalum (Ta), zirconium (Zr), hafnium (Hf), titanium (Ti), chromium (Cr), niobium (Nb), yttrium (Y), vanadium (V), molybdenum (Mo), tungsten (W), or boron (B); and wherein the ferromagnetic layers comprise magnetization direction oriented substantially parallel to an air-bearing surface of the reader.

14. The reader of claim 13, wherein a concentration of Fe in the CoFe alloy is from 20 atomic % to 80 atomic %.

15. The magnetoresistive sensor of claim 1, wherein the separation layers reduce a magnetocrystallinity of the layered stack as compared to an otherwise identical stack with no separation layers present.

16. The reader of claim 13, wherein the separation layers reduce a magnetocrystallinity of the layered stack as compared to an otherwise identical stack with no separation layers present.

* * * * *